United States Patent
Yamada

(10) Patent No.: US 7,199,859 B2
(45) Date of Patent: Apr. 3, 2007

(54) EXPOSURE EQUIPMENT AND CONTROL METHOD OF THE SAME

(75) Inventor: Keiji Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 11/117,434

(22) Filed: Apr. 29, 2005

(65) Prior Publication Data
US 2006/0160268 A1    Jul. 20, 2006

(30) Foreign Application Priority Data
Jan. 14, 2005    (JP) ............................. 2005-007964

(51) Int. Cl.
*G03B 27/52*    (2006.01)
*G03B 27/42*    (2006.01)
(52) U.S. Cl. .......................................... 355/30; 355/53
(58) Field of Classification Search ................ 355/30, 355/53, 27, 29; 430/5, 20, 22; 396/611; 118/54
See application file for complete search history.

(56) References Cited

U.S. PATENT DOCUMENTS

| 6,960,257 | B2 * | 11/2005 | Thompson et al. | ............ 118/52 |
| 2004/0187542 | A1 * | 9/2004 | Edo | .......................... 55/385.2 |
| 2005/0063799 | A1 * | 3/2005 | Larson et al. | ................ 414/217 |

OTHER PUBLICATIONS

Patent Abstracts of Japan, Publication No. 07176458, published on Jul. 14, 1995.

* cited by examiner

*Primary Examiner*—Henry Hung Nguyen
*Assistant Examiner*—Chia-how Michael Liu
(74) *Attorney, Agent, or Firm*—Westerman, Hattori, Daniels & Adrian, LLP

(57) ABSTRACT

A controller controls a wafer carrier to move from a SMIF-POD to transfer and collect a wafer between a space of a transfer unit through a thermal chamber. The wafer carrier is returned into the SMIF-POD, when the wafer is exposed, to be kept waiting in the SMIF-POD until the wafer completes the exposure. The wafer can be shielded from direct airflow by a protection plate inside the transfer area.

13 Claims, 7 Drawing Sheets

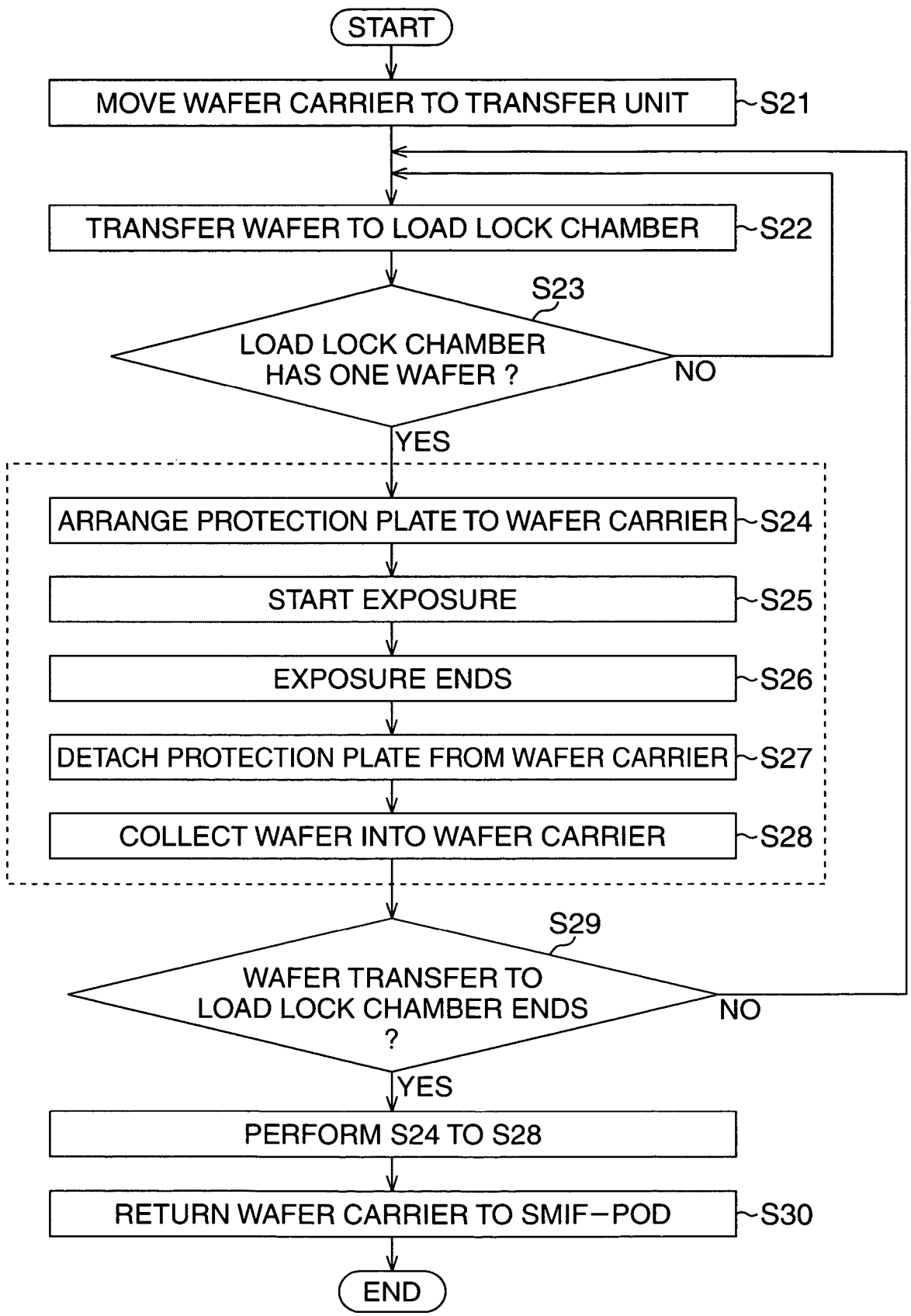

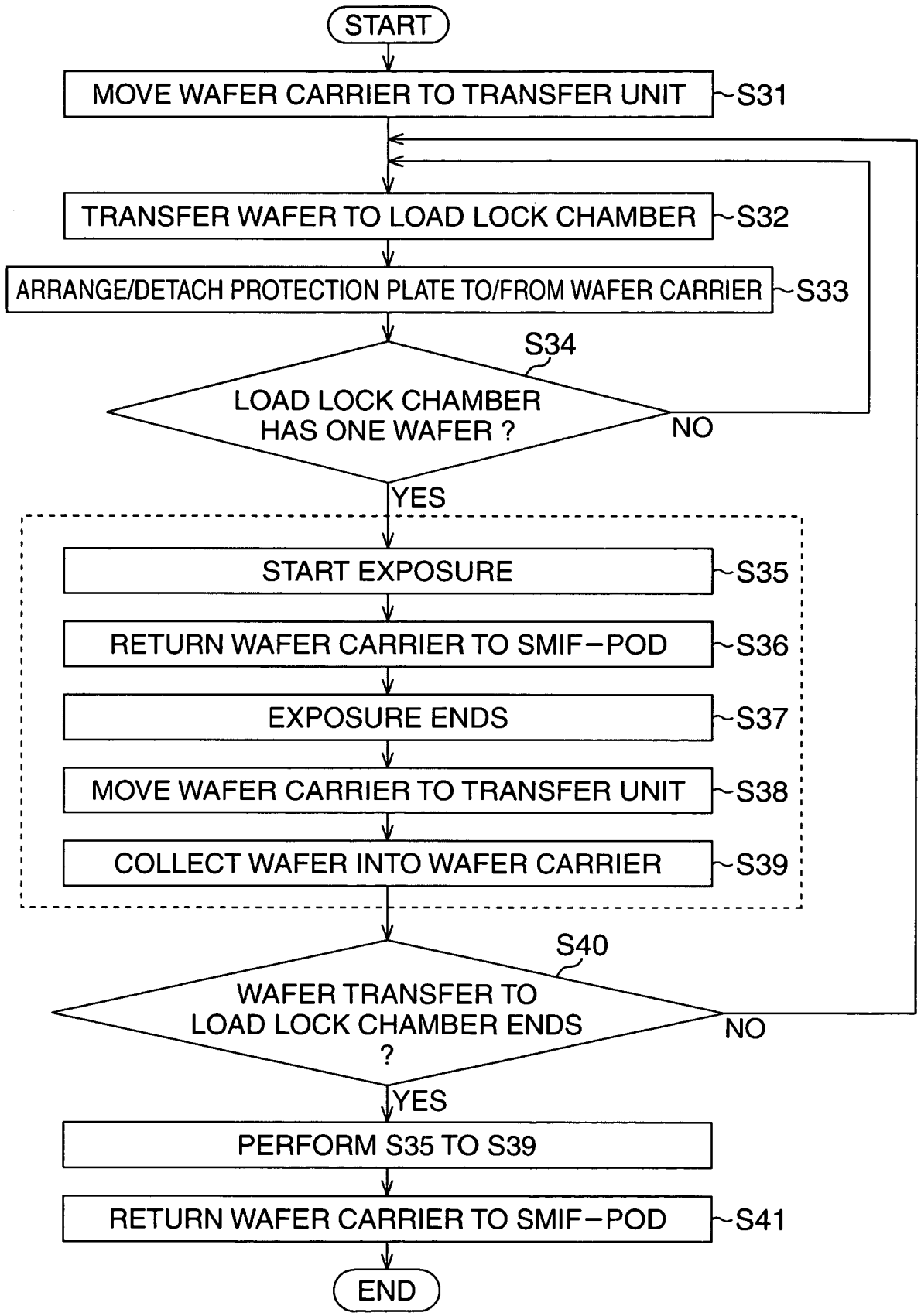

EXPOSURE EQUIPMENT AND CONTROL METHOD OF THE SAME

CROSS-REFERENCE TO RELATED APPLICATIONS

This application is based upon and claims the benefit of priority from the prior Japanese Patent Application No. 2005-007964, filed on Jan. 14, 2005, the entire contents of which are incorporated herein by reference.

BACKGROUND OF THE INVENTION

1. Field of the Invention

The present invention relates to an exposure equipment to fabricate a semiconductor element, a magnetic head, or the like, and a controlling method of the same.

2. Description of the Related Art

Conventionally, when fabricating a semiconductor element, a magnetic head, or the like, a lithography technology has been in use, in which a predetermined pattern is transferred onto a resist coated on a wafer surface by an exposure to light. As a system configuration to perform an exposure using a beam such as ultraviolet or laser as a lithography process, there is a lithography system of a so-called inline type, in which a resist coating equipment, exposure equipment, and the like are unified.

On the other hand, as a system configuration to perform an electron-beam exposure, there is a lithography system configured to install therein the exposure equipment and the other equipment such as the resist coating equipment separately. This lithography system is sometimes operated also when performing an exposure using the ultraviolet or laser beam. In this lithography system, the exposure equipment is configured to include an equipment to expose a wafer surface, a container such as a SMIF (Standard Mechanical Interface)-POD to contain a wafer carrier containing a wafer so as to transfer the wafer between the equipment and the other equipment, and a transfer unit having a space to transfer the wafer carrier between the container to/from the equipment and the other equipment.

In this case, the wafer and a peripheral portion thereof require extremely high cleanliness, it is therefore necessary to constantly maintain the inside of the space of the transfer unit to be clean, by providing, for example, a HEPA filter into the transfer unit to be a transfer path of the wafer so that an airflow (clean air) is generated in the transfer unit by using the HEPA filter.

In the lithography system in which an exposure equipment and the other equipment are separately installed, a wafer is exposed to an atmospheric airflow in the transfer unit during the time from the end of a resist coating step and to the start of an exposure step. In the case of an electron-beam exposure, in particular, the exposure for wafer takes an extremely long time. Therefore, when many wafers are set in a wafer carrier, those wafers to be exposed later end up to be exposed to the atmospheric airflow for hours. Depending on the waiting time, a reaction between the resist and a base or the like shows a progress, exercising an unacceptable effect on a line width of a pattern to be formed. Such a problem is becoming unignorable recently on the back of a progress in microfabrication of the semiconductor elements, in which the allowable error range related to the line width is becoming smaller.

In Japanese Patent Application Laid-Open No. Hei 7-176458 (Patent Document 1), there is disclosed a technique, in which the repeatability of an exposed pattern is controlled by controlling a time from post-exposure to pre-development in relation to the resist on the wafer surface. However, even with this technique, it is extremely difficult to suppress the line width fluctuation of the pattern, once the resist suffers deterioration caused by a long-time exposure to the airflow.

SUMMARY OF THE INVENTION

The present invention has been made in view of the above-described problems, and an object thereof is to provide, in a lithography system in which an exposure equipment and the other equipment are separately installed, an exposure equipment capable of suppressing a line width fluctuation of a pattern by preventing deterioration of a resist, and of realizing a highly reliable exposure that can adequately respond to a further microfabrication of the patterns, even if a processing for a wafer takes an extremely long time as in an electron-beam exposure, and a controlling method thereof.

An exposure equipment according to the present invention is composed of: a wafer carrier being flexibly movable and containable plural wafers being subject to exposure; a container containing the wafer carrier in an attachable/detachable manner; an equipment including a mounting table for the wafer in an exposure chamber thereof and exposing a surface of the wafer mounted on the mounting table; a transfer area including, between the container and the equipment, a transfer unit having a space to transfer the wafer carrier therethrough and an airflow generating unit generating an airflow in the space of the transfer unit to maintain cleanliness in the transfer unit; and a controller controlling a transfer operation of the wafer carrier and the wafer; in which the controller moves the wafer carrier from the container, controls a transfer and a collection of the wafer between an inside of the space of the transfer unit and the equipment, returns the wafer carrier into the container when the wafer is exposed to keep the wafer carrier waiting in the container until the wafer completes the exposure.

Another exposure equipment according to the present invention is composed of: a wafer carrier being flexibly movable and containable plural wafers being to be subject to exposure; a container containing the wafer carrier in an attachable/detachable manner; an equipment including a mounting table for the wafer in an exposure chamber thereof and exposing a surface of the wafer mounted on the mounting table; a transfer area including, between the container and the equipment, a transfer unit having a space to transfer the wafer carrier therethrough and an airflow generating unit generating an airflow in the space of the transfer unit to maintain cleanliness in the transfer unit; and a controller controlling a transfer operation of the wafer carrier and the wafer; in which the transfer area includes a protection plate for the wafer carrier and a protection plate arrangement mechanism to arrange the protection plate so as to shield the containable plural wafers in the wafer carrier against the airflow when the wafer carrier is transferred to the transfer unit by the controller.

A control method of an exposure equipment according to the present invention is composed of the steps of, by an exposure equipment including a wafer carrier being flexibly movable and containable plural wafers being subject to exposure; a container containing the wafer carrier in an attachable/detachable manner; an equipment including a mounting table for the wafer in an exposure chamber thereof and exposing a surface of the wafer mounted on the mounting table; a transfer area including, between the container and the equipment, a transfer unit having a space to transfer the wafer carrier therethrough and an airflow generating unit generating an airflow in the space of the transfer unit to maintain cleanliness in the transfer unit; and a controller controlling a transfer operation of the wafer carrier and the wafer: moving the wafer carrier from the container to the space of the transfer unit; transferring the wafer from the inside of the space of the transfer unit to the equipment; exposing the surface of the wafer set on the mounting table; returning the wafer carrier into the container when the wafer is exposed to keep the wafer carrier waiting in the container until the wafer completes the exposure; moving the wafer carrier from the container to the space of the transfer unit when the wafer completes the exposure; and collecting the wafer completing the exposure from the equipment to the wafer carrier.

Another control method of an exposure equipment according to the present invention is composed of, by using an exposure equipment including a wafer carrier being flexibly movable and containable plural wafers being subject to exposure; a container containing the wafer carrier in an attachable/detachable manner; an equipment including a mounting table for the wafer in an exposure chamber thereof and exposing a surface of the wafer mounted on the mounting table; and a transfer area including, between the container and the equipment, a transfer unit having a space to transfer the wafer carrier therethrough and an airflow generating unit generating an airflow in the space of the transfer unit to maintain cleanliness in the transfer unit; moving the wafer carrier from the container to the space of the transfer unit; transferring the wafer from the space of the transfer unit to the equipment; exposing the surface of the wafer set on the mounting table; arranging a protection plate to shield the containable plural wafers in the wafer against the airflow at least when the wafer is exposed; and collecting the wafer completing the exposure from the equipment to the wafer carrier.

BRIEF DESCRIPTION OF THE DRAWINGS

FIG. 5 is a flowchart showing a basic operation of the electron beam exposure equipment with the SMIF according to the second embodiment;

FIG. 7 is a flowchart showing a basic operation of an electron beam exposure equipment with a SMIF according to a third embodiment.

DETAILED DESCRIPTION OF THE PREFERRED EMBODIMENTS

—Basic Gist of the Present Invention—

Figure 1:
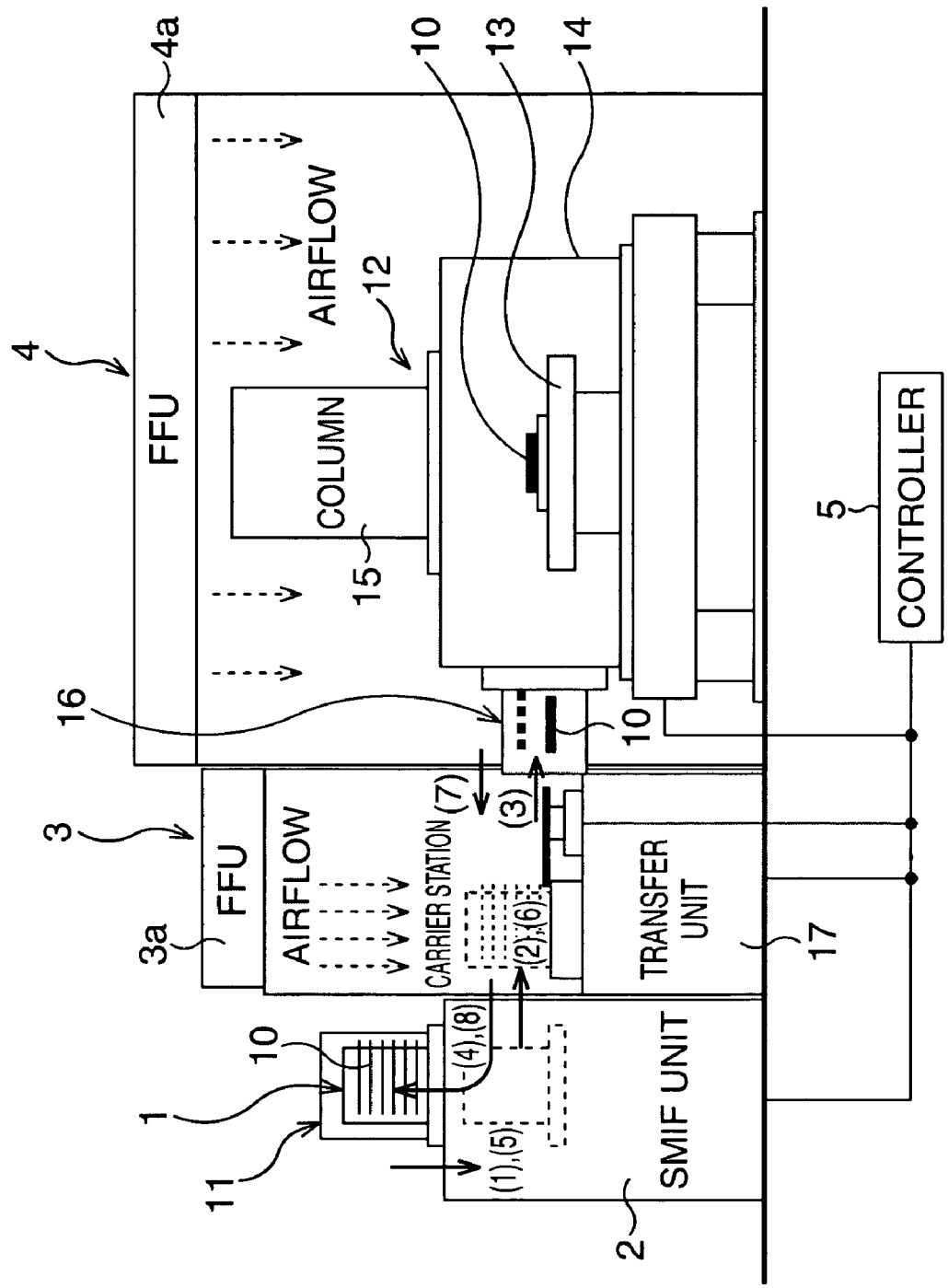
FIG. 1 is a schematic view showing a schematic configuration of an electron beam exposure equipment with a SMIF unit according to a first embodiment.

A deterioration of a coated resist before exposure, which leads to a line width fluctuation of a pattern, can be considered due mainly to a long time exposure of a wafer to airflow in a transfer unit. In order to maintain the wafer and a peripheral portion thereof to be clean, it is necessary to design to generate the airflow in the space of the transfer unit. On the back of this, as an approach to reduce the exposure time of the wafer to the airflow in the transfer unit as much as possible, the present inventor has conceived a configuration as will be described below.

(1) A wafer carrier is moved from a container, controls are performed to transfer and collect a wafer between an inside space of a transfer unit and an equipment, and the wafer carrier is returned into the container when the wafer is exposed to wait in the container until the wafer completes the exposure. In an exposure equipment according to the present invention, the above-mentioned operation is implemented by a controller. Specifically, the controller transfers the wafers from the wafer carrier positioning in the space of the transfer unit to the equipment until the wafers placed in the equipment attains an upper limit in number containable in the equipment, and when the number attains the upper limit, the controller returns the wafer carrier from the space of the transfer unit to the container. With this configuration, even if an exposure of the wafer takes a long time, it is possible to suppress the line width fluctuation of the pattern to a minimum level while maintaining cleanliness in the space of the transfer unit without exposing the other wafer in waiting to the airflow.

(2) A protection plate and a protection plate arrangement mechanism are provided in the transfer area, the protection plate being arranged by the protection plate arrangement mechanism so as to shield the containable plural wafers in the wafer carrier against the airflow when the wafer carrier is sent to the transfer unit by the controller and, at least, when the wafer is exposed. At this time, preferably, the protection plate is arranged not only when the exposure is performed, but also when the wafer carrier positions in the space of the transfer. As a protection plate, that having a shape to shield such a portion of the wafer carrier that confronts an airflow direction or that having a shape covering the wafer carrier to isolate the wafer carrier from the space of the transfer unit by sealing the wafer carrier is preferable. With this configuration, even if the exposure of the wafer takes a long time, it is possible to suppress the line width fluctuation of the pattern to a minimum level while maintaining cleanliness in the space of the transfer unit without exposing the other wafer in waiting to the airflow by shielding the other wafer against the airflow.

(3) The above (1) and (2) are combined. Specifically, the wafer carrier is moved from the container, controls are performed to transfer and collect the wafer between the space of the transfer unit and the equipment, and the wafer carrier is returned into the container when the wafer is exposed to wait in the container until the wafer completes the exposure. Further, when the wafer positions in the space of the transfer unit, the protection plate is arranged for the wafer carrier by the protection plate arrangement mechanism. Even though a slight line width fluctuation is probably no need to be concerned since the wafer carrier is inevitably exposed to the airflow in the space of the transfer unit even though it is a short time period as compared to the exposure time, with this configuration, the airflow to the wafer carrier is shielded even for the short time, so that the line width fluctuation of the patterns is further suppressed and the pattern exposure of an extremely high reliability can be obtained.

—Specific Embodiments applying the Present Invention—

Hereinafter, specific embodiments applying the present invention to an electron-beam exposure equipment will be described in detail with reference to the drawings.

First Embodiment

[Basic Configuration of Electron-Beam Exposure Equipment]

FIG. 1 is a schematic view showing an electron-beam exposure equipment with a SMIF unit according to a first embodiment.

The electron-beam exposure equipment according to the present embodiment is configured to include a wafer carrier 1 containing wafers being subject to exposure, in this case, semiconductor wafers 10, a SMIF unit 2, an equipment body 12 exposing the wafer 10, a transfer area 3 provided between the SMIF unit 2 and the thermal chamber 4 to be a transfer path of the wafers 10, a controller 5 controlling a transfer operation or the like of the wafer carrier 1 and the wafers 10.

The wafer carrier 1 is designed to contain two or more wafers 10 and be movable between the SMIF unit 2 and the thermal chamber 4 or the other equipment via the transfer area 3.

The SMIF unit 2 includes a SMIF-POD 11 containing the wafer carrier 1 in an attachable/detachable manner. The wafer carrier 1 detached from the SMIF-POD 11 is sent to the transfer area 3 through inside the SMIF unit 2.

Note that an example in which the SMIF unit 2 and the transfer area 3 are provided separately is presented in the present embodiment, whereas the SMIF unit 2 and the transfer area 3 may be configured to be installed as one unit.

The thermal chamber 4 includes an equipment body 12 exposing a resist coated on the surface on the wafer 10. The equipment body 12 is configured to include a load lock chamber 16 provided at a portion connected to an exposure chamber 14 inside which a wafer stage 13 to mount and secure the wafer 10 thereon is installed, a column 15, and the transfer area 3. For the load lock chamber 16 provided at the portion connected to the exposure chamber 14 and the column 15, a vacuum exhaust mechanism (not shown) to hold the inside thereof with high vacuum are provided. For the thermal chamber 4, a so-called FFU (Fan Filter Unit) 4a to maintain inside of the chamber to be clean is provided, and thereby the airflow that is generated in the thermal chamber 4 is always in operation. The thermal chamber 4 has functions to stabilize temperatures at the column 15, the load lock chamber 16, and the exposure chamber 14, and to improve cleanliness of the entire body of the system.

The load lock chamber 16 is an extra exhaust chamber to transfer the wafer 10, which is transferred from the transfer area 3, to the exposure chamber 14 with a function to isolate the wafer 10 from the airflow by the FFU 4a in the thermal chamber 4 and a FFU 3a in the transfer area 3, in which at least one wafer being subject to the exposure, here a single wafer, is containable. Accordingly, in this case, the number of wafers containable in both the load lock chamber 16 and exposure chamber 14 (hereinafter referred to as "two vacuum chambers") is two. Depending on the configuration of the load lock chamber 16, two or more wafers can be contained.

In the transfer area 3, there is formed a transfer unit 17 including a space (carrier station) into which the wafer carrier 1 is sent. In the transfer unit 17, there is provided a transfer mechanism to transfer the wafers 10, which are sent to the transfer unit 17, into the thermal chamber 4 by bringing out the wafers 10 one by one from the wafer carrier 1. In the transfer area 3, as in the thermal chamber 4, there is provided the FFU 3a to maintain inside the transfer unit 17 to be clean, and thereby the airflow is generated inside the transfer unit 17 always in operation.

The controller 5 performs such controls that moves the wafer carrier 1 from the SMIF-POD 11, that transfers and collects the wafer 10 between inside the space of the transfer unit 17 and the two vacuum chambers, and that returns the wafer carrier 1 into the SMIF-POD 11 when the wafer 10 is exposed to keep the wafer carrier 1 waiting in the SMIF-POD 11 until the wafer 10 completes the exposure.

Specifically, the controller 5 transfers the wafers 10 from the wafer carrier 1 positioning in the space of the transfer unit 17 to the two vacuum chambers until the number of the wafers contained in the two vacuum chambers comes to the upper limit containable therein, namely two pieces here; and after the upper limit is attained, the controller 5 returns the wafer carrier 1 from the space of the transfer unit 17 to the SMIF-POD 11.

[Basic Operation of Electron-Beam Exposure Equipment]

Figure 2:
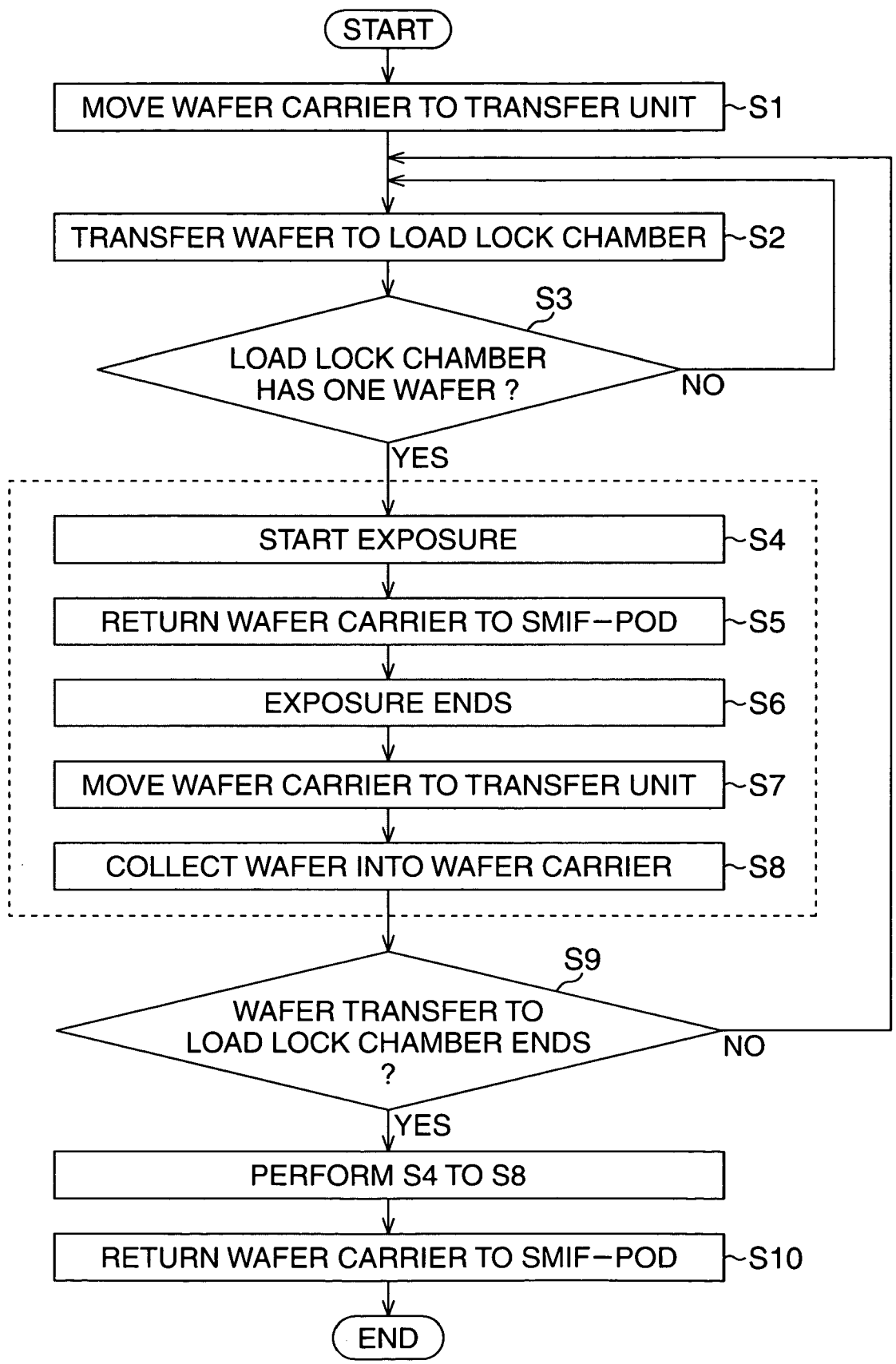
FIG. 2 is a flowchart showing a basic operation of the electron beam exposure equipment with the SMIF unit according to the first embodiment.

FIG. 2 is a flow chart showing a basic operation of the electron-beam exposure equipment with the SMIF unit according to the first embodiment.

In the electron-beam exposure equipment according to the present embodiment, the basic operation including transfer, collection, and exposure of the wafer 10, which will be described below, is placed under the control of the controller 5.

First, as (1) and (2) in FIG. 1, the wafer carrier 1 containing plural wafers 10, each of which is coated with the resist on the surface thereof, is moved from the SMIF-POD 11 through inside the SMIF unit 2 into the space of the transfer unit 17 in the transfer area 3 (Step S1).

Subsequently, as (3) in FIG. 1, the wafers 10 start to be transferred one by one from the wafer carrier 1 positioning in the transfer unit 17 to the load lock chamber 16 situated in the thermal chamber 4 using the transfer mechanism provided in the transfer area 3 (Step S2).

In the present embodiment, the load lock chamber 16 can contain a single piece of wafer 10 being subject to exposure at the maximum, and two pieces of the wafer 10 can be contained in total in both the two vacuum chambers at the maximum including another one wafer 10 existing in the exposure chamber 14. In the case of an exposure equipment of a so-called twin column type having two columns, two exposure chambers, and two load lock chambers in one unit, two pieces of wafers can be contained in each one, respectively. The wafer 10 transferred to the load lock chamber 16 is transferred into the exposure chamber 14 to be mounted and secured onto the wafer stage 13 in the order of FIFO, first in the load lock chamber 16, first thereout.

Subsequently, a determination is made to determine whether or not the number of wafers 10 contained in the load lock chamber 16 attains the upper limit value, here whether or not the number attains one; in other words, a determination is made to determine whether or not the two wafers 10 exist in accordance with the two vacuum chambers situated in the thermal chamber 4 (Step S3).

In Step S3, when it is determined that the upper limit value number is not attained, then the transfer of the wafer 10 to the load lock chamber 16 in Step S2 is continued until the upper limit value is attained. Meanwhile, when it is determined that the upper limit value is attained, then the wafers 10 mounted and secured onto the wafer stage 13 in the exposure chamber 14 is started to be exposed (Step S4). Note that, in the initial stage of this basic operation, in the case for example of the first wafer 10, the exposure may be designed to start at the step where the first wafer 10 is mounted and secured onto the wafer stage 13 in the exposure chamber 14 after being transferred from the wafer carrier 1 positioning in the transfer unit 17 via the load lock chamber 16.

At this time, as (4) in FIG. 1, when the exposure in Step S4 is started, the wafer carrier 1 positioning in the transfer unit 17 is returned from the transfer unit 17 to the SMIF-POD 11 (Step S5).

Generally, an electron-beam exposure takes a long time, and when the wafer carrier 1 is kept waiting in the transfer unit 17 during that time, the wafer 10 in the wafer carrier 1 is exposed to the airflow generated by the FFU 3a. In the present embodiment, when the wafer 10 is exposed (or when the number of the wafer(s) 10 contained in the load lock chamber 16 attains the upper limit value), the wafer carrier 1 is returned to the SMIF-POD 11 to let the SMIF-POD 11 wait in the state of containing the wafer carrier 1, so that no wafer 10 is left in the transfer unit 17 during the exposure. Accordingly, it is possible to prevent the line width fluctuation of the pattern due to the wafer carrier 1 waiting in the transfer unit 17, without limiting any airflow generated by the FFU 3a.

As (5) and (6) in FIG. 1, when the exposure of the wafer 10 mounted and secured onto the wafer stage 13 is completed (Step S6), the wafer carrier 1 contained and kept waiting in the SMIF-POD 11 is moved again into the space of the transfer unit 17 in the transfer area 3 (Step S7).

Subsequently, as (7) in FIG. 1, the wafer 10 completing the exposure is collected into the wafer carrier 1 via the load lock chamber 16 from the inside of the exposure chamber 14 (Step S8).

Subsequently, a determination is made to determine whether or not the wafer 10 being not yet subject to the exposure exists in the wafer carrier 1, in other words, whether or not there is any wafer 10 that should be transferred to the load lock chamber 16 from the wafer carrier 1 positioning in the transfer unit 17 (Step S9).

When it is determined that there is the wafer 10 being not yet subject to exposure, then the Steps S2 to S9 are repeated once again.

Meanwhile, in Step S9, when it is determined that there is no wafer 10 being not yet subject to exposure, the respective steps related to the exposure of the wafer 10 existing in the two vacuum chambers, the waiting of the wafer carrier 1 in the SMIF-POD 11, and the collection of the exposed wafer 10 are performed in sequence. In other words, the Steps S4 to S8 (the steps surrounded by a broken line in FIG. 2) are performed. The series of Steps S4 to S8 to be performed when it is determined that there is no wafer 10 being not yet subject to the exposure is repeated times, "n" (once in the present embodiment) being the number of times corresponding to the maximum number "n" of the wafer(s) 10 ("one" piece in this case) containable in the load lock chamber 16.

As a result of the above, every wafer 10 contained in the wafer carrier 1 has/have been exposed and collected into the wafer carrier 1.

After that, as (8) in FIG. 1, the wafer carrier 1 positioning in the transfer unit 17 is returned from the transfer unit 17 to the SMIF-POD 11 (Step S10) to end the basic operation.

It should be noted that, in the above description, the basic operation in which every wafer 10 contained in the wafer carrier 1 are exposed is described, however, the other basic operation in which a part of the wafers 10 contained in the wafer carrier 1 are appropriately exposed is also acceptable. For instance, in the case of the wafer carrier 1 containing "a" (a>b≧1) pieces of wafers 10, when the exposure is performed only to "b" pieces of wafers 10, what to do is simply to configure to perform the series of Steps S4 to S8 once after the "bth" wafer 10 is transferred to the load lock chamber 16.

As described above, according to the exposure equipment and the controlling method thereof of the present embodiment, even if the processing for a wafer 10 takes an extremely long time as in the case of the electron-beam exposure, the deterioration of the resist can be prevented to thereby suppress the line width fluctuation of the pattern, so that a highly reliable exposure that can adequately respond to further microfabrication of the patterns can be realized.

Second Embodiment

[Basic Configuration of Electron-Beam Exposure Equipment]

Figure 3:
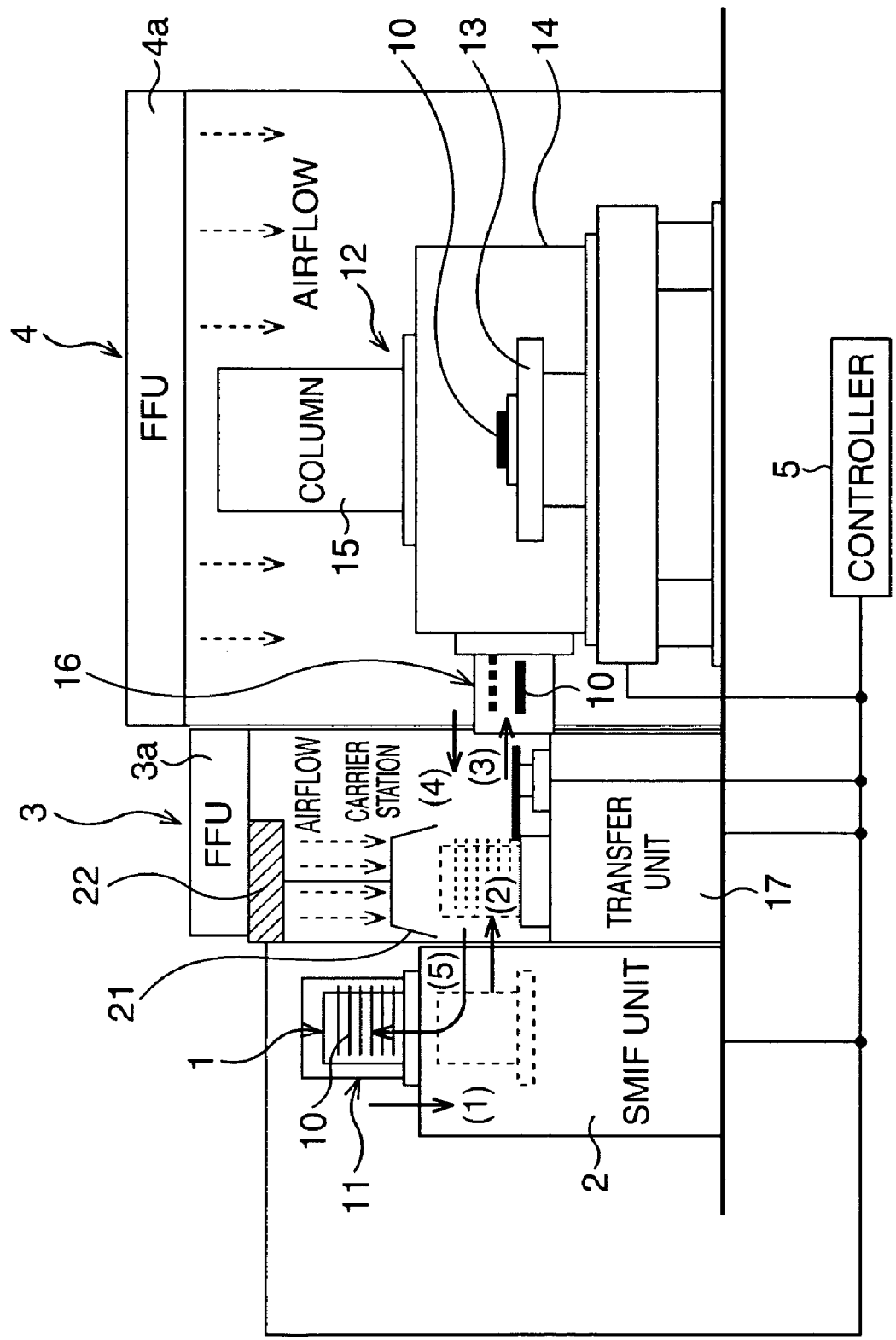
FIG. 3 is a schematic view showing a schematic configuration of an electron beam exposure equipment with a SMIF unit according to a second embodiment.

FIG. 3 is a schematic view showing a schematic configuration of an electron-beam exposure equipment with a SMIF unit according to a second embodiment. Here, the same component or so forth as of the electron-beam exposure equipment according to the first embodiment will be denoted by the same numerical reference and the description thereof will be omitted. The electron-beam exposure equipment according to the present embodiment is configured to include a protection plate 21 for the wafer carrier 1 and a protection plate arrangement mechanism 22 in the transfer area 3 in addition to the respective components shown in FIG. 1.

Figure 4A:
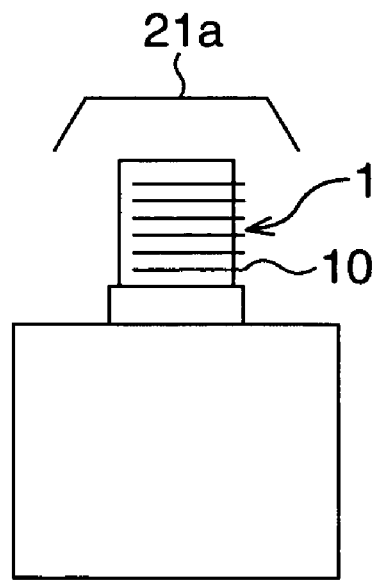
FIGS. 4A and 4B are schematic views showing embodiments of a protection plate.
Figure 4B:
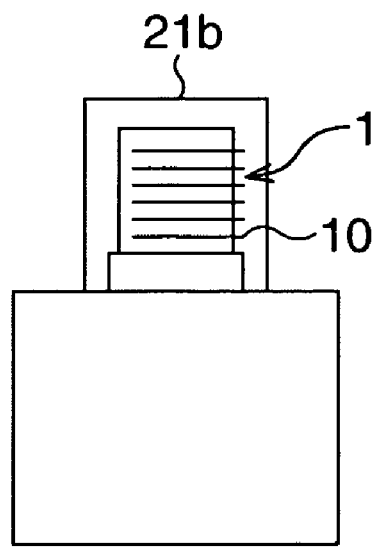

The protection plate 21 is to shield the containable plural wafers in the wafer carrier 1 against the airflow generated by the FFU 3a when the wafer carrier 1 is sent to the transfer unit 17 by the controller 5, for example, when the wafer 10 is exposed. As a specific example of the protection plate 21, as shown in FIG. 4A, a shielding plate 21a of a shape shielding such a portion of the wafer carrier 1 that confronts an airflow direction, in this case, only the upper surface of the wafer carrier 1, and, as shown in FIG. 4B, a shroud 21b of a shape covering the wafer carrier 1 so as to isolate the wafer carrier 1 from the space of the transfer unit 17 by way of sealing the wafer carrier 1 are preferable. In FIG. 3, as one protection plate 21, the shielding plate 21a is shown as an example. In particular, when the shroud 21b is used, the wafer carrier 1 is isolated from the airflow almost completely, so that the line width fluctuation of the pattern due to the contact of the surface of the wafer 10 with the airflow can be suppressed to a minimum level.

The protection plate arrangement mechanism 22 is to control the action of the protection plate 21 when the wafer carrier 1 is sent to the transfer unit 17 by the controller 5 in an aim to shield the containable plural wafers in the wafer carrier 1 against the airflow. The activation of the protection plate arrangement mechanism 22 is controlled overall for example by the controller 5. The protection plate arrangement mechanism 22 arranges the protection plate 21 for the wafer carrier 1 not only when the wafer 10 is exposed but also when the wafer carrier 1 is positioned in the space of the transfer unit. 17 and the wafer 10 is exposed.

[Basic Operation of Electron-Beam Exposure Equipment]

FIG. 5 is a flowchart showing a basic operation of an electron-beam exposure equipment with a SMIF unit according to the second embodiment.

In the electron-beam exposure equipment according to the present embodiment, the basic operation including transfer, collection, and exposure of the wafer 10, which will be described below, is placed under the control of the controller 5 and the protection plate arrangement mechanism 22.

First, as (1) and (2) in FIG. 3, the wafer carrier 1 containing plural wafers 10, each of which is coated with the resist on the surface thereof, is moved from the SMIF-POD 11 through inside of the SMIF unit 2 into the space of the transfer unit 17 in the transfer area 3 (Step S21).

Subsequently, as (3) in FIG. 3, with the use of the transfer mechanism provided in the transfer area 3, the wafers 10 start to be transferred one by one into the load lock chamber 16 situated inside the thermal chamber 4 from the wafer carrier 1 positioning in the transfer unit 17 (Step S22).

In the present embodiment, the load lock chamber 16 can contain a single piece of wafer 10 being subject to exposure at the maximum, and two pieces of the wafer 10 can be contained in total in both the two vacuum chambers at the maximum including another one wafer 10 existing in the exposure chamber 14. The wafer 10 transferred to the load lock chamber 16 is transferred into the exposure chamber 14 to be mounted and secured onto the wafer stage 13 in the order of FIFO, first in the load lock chamber 16, first thereout.

Subsequently, a determination is made to determine whether or not the number of wafers 10 contained in the load lock chamber 16 attains the upper limit value, here whether or not the number attains one; in other words, a determination is made to determine whether or not the two wafers 10 exist in the thermal chamber 4 (Step S23).

In Step S23, when it is determined that the upper limit value number is not attained, then the transfer of the wafer 10 to the load lock chamber 16 in Step S22 is continued until the upper limit value is attained. Meanwhile, when it is determined that the number attains the upper limit value, then, by a control of the protection plate arrangement mechanism 22 based on the controller 5, the protection plate 21 is arranged to the wafer carrier 1 (Step S24). At this time, when the protection plate 21 is the shielding plate 21a, the shielding plate 21a is arranged such that only the upper surface of the wafer carrier 1 is shielded, while when the protection plate 21 is the shroud 21b, the shroud 21b is arranged to cover the wafer carrier 1 so that the wafer carrier 1 is isolated from the space of the transfer unit 17.

Note that, in the above description, the protection plate 21 is configured to be arranged to the wafer carrier 1 after it is confirmed that the load lock chamber 16 contains the upper limit number of the wafer(s), however, it is also possible that the protection plate 21 is configured to be arranged during the time just after the wafer 10 is transferred to the load lock chamber 16 in Step S22 and before the next wafer 10 is transferred, and is detached from the wafer carrier 1 when the wafer 10 is transferred. With this configuration, it is possible to further suppress the line width fluctuation of the pattern in the wafer 10.

Then, the exposure of the wafer 10 mounted and secured onto the wafer stage 13 in the exposure chamber 14 is started (Step S25). Note that, in the initial stage of the basic operation, in the case for example of the first wafer 10, the exposure may be designed to start at a step where the wafer 10 is mounted and secured onto the wafer stage 13 in the exposure chamber 14 after being transferred from the wafer carrier 1 positioning in the transfer unit 17 via the load lock chamber 16.

When the exposure of the wafer 10 mounted and secured onto the wafer stage 13 is completed (Step S26), the protection plate 21 is made to be detached from the wafer carrier 1 by the control of the protection plate arrangement mechanism 22 based on the controller 5 (Step S27). Then, as (4) in FIG. 3, the wafer 10 completing the exposure is collected into the wafer carrier 1 via the load lock chamber 16 from the inside of the exposure chamber 14 (Step S28).

Subsequently, a determination is made to determine whether or not the wafer 10 being not yet subject to the exposure exists in the wafer carrier 1, in other words, whether or not there is any wafer 10 that should be transferred to the load lock chamber 16 from the wafer carrier 1 positioning in the transfer unit 17 (Step S29).

When it is determined that there is the wafer 10 being not yet subject to exposure, then the Steps S22 to S29 are repeated once again.

Meanwhile, in Step S29, when it is determined that there is no wafer 10 being not yet subject to exposure, the respective steps related to the exposure of the wafers 10 existing in the two vacuum chambers, the waiting of the wafer carrier 1 in the SMIF-POD 11, and the collection of the exposed wafer 10 are performed in sequence. In other words, the Steps S24 to S28 (the steps surrounded by a broken line in FIG. 5) are performed. The series of Steps S24 to S28 to be performed when it is determined that there is no wafer 10 being not yet subject to the exposure is repeated times, "n" (once in the present embodiment) being the number of times corresponding to the maximum number "n" of the wafer(s) 10 ("one" piece in this case) containable in the load lock chamber 16.

As a result of the above, every wafer 10 contained in the wafer carrier 1 has been exposed and collected into the wafer carrier 1.

After that, as (5) in FIG. 3, the wafer carrier 1 positioning in the transfer unit 17 is returned from the transfer unit 17 to the SMIF-POD 11 (Step S30) to end the basic operation.

It should be noted that, in the above description, the basic operation in which every wafer 10 contained in the wafer carrier 1 are exposed is described, however, the other basic operation in which a part of the wafers 10 contained in the wafer carrier 1 are appropriately exposed is also acceptable. For instance, in the case of the wafer carrier 1 containing "a" (a>b≧1) pieces of wafers 10, when the exposure is performed only to "b" pieces of wafers 10, what to do is simply to configure to perform the series of Steps S24 to S28 once after the "bth" wafer 10 is transferred to the load lock chamber 16.

Here, with regard to the line width fluctuation of the patterns in the wafer 10 that is exposed by the control method of the exposure equipment according to the second embodiment, an experiment is conducted based on a comparison with the case in which no protection plate 21 is arranged to the wafer carrier 1 and thereby the wafer carrier 1 is exposed to the airflow in the transfer unit 17 for a long time at the time of the exposure (conventional configuration).

Figure 6:
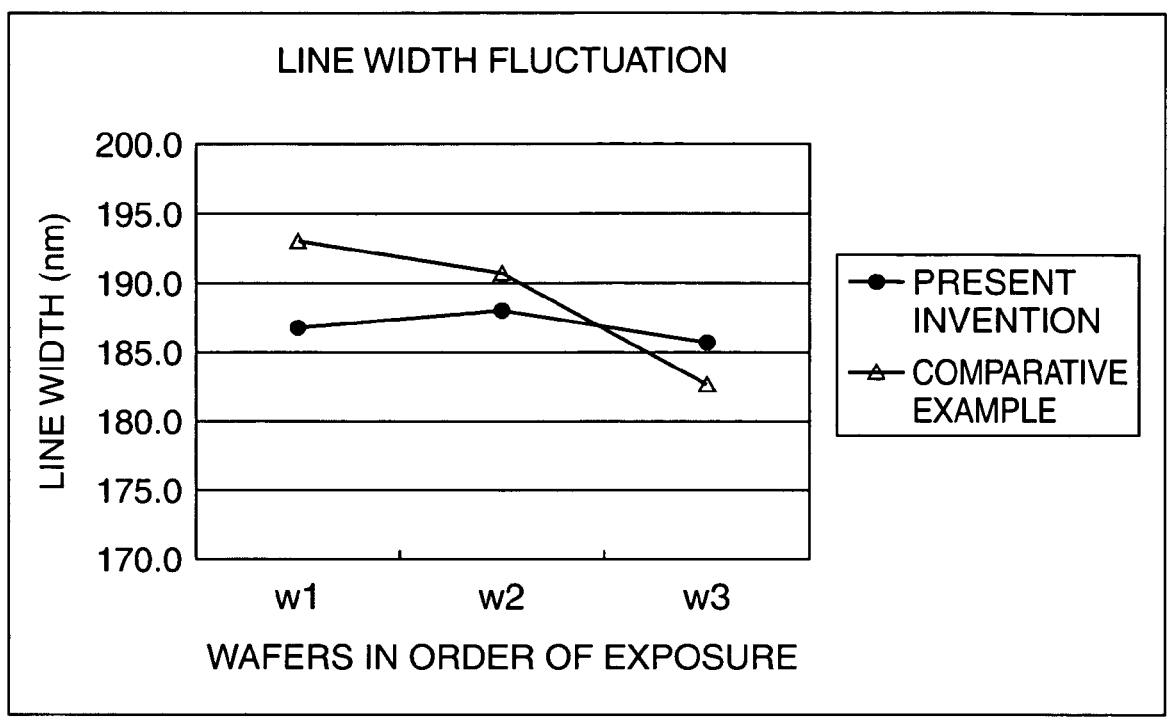
FIG. 6 is a characteristic view showing line width fluctuations of patterns.

The experimental result is shown in FIG. 6. In this comparison example, a large line width fluctuation can be seen in the patterns of the third wafer 10, which was exposed to the airflow for a long time of about three hours in the wafer carrier 1 while the first wafer 10 is exposed, in comparison with those of the first wafer 10. On the other hand, in the case of this embodiment, the third wafer 10 stays in the transfer unit 17 in the state of being contained in the wafer carrier 1 for a long time of about three hours in the same manner as in the comparison example, while the wafer 10 is shielded by the protection plate 21 against the influence of the airflow, allowing the fluctuation as little as possible, it is thereby found that the patterns of a stable line width can be obtained.

As described above, according to the exposure equipment and the controlling method thereof of the present embodiment, even if the processing for a wafer 10 takes an extremely long time as in the case of the electron-beam equipment, the influence of the airflow on the wafer 10 is shielded, thereby the deterioration of the resist is prevented to thereby suppress the line width fluctuation of the pattern, so that a highly reliable exposure that can adequately respond to further microfabrication of the patterns can be realized.

Incidentally, as for the composition of a resist to be coated on a wafer, that which responds to a laser-beam and that which responds to an electron-beam are basically the same. Further, in the electron-beam exposure, depending on the wafer to be processed, there is a case where an antistatic film is coated further on the resist surface, in which, depending on the conditions and the composition ratio thereof, the fluctuation amount may be large or small. On the basis of this fact, when the resist of the wafer 10 is especially sensitive to an atmospheric airflow, it is preferable to adopt the method of the first embodiment.

Third Embodiment

In a third embodiment, a combined configuration of the above-described first and second embodiments will be disclosed.

The schematic configuration of the electron-beam exposure equipment according to the present embodiment is the same as that in FIG. 3 (and FIG. 4).

[Basic Operation of Electron-Beam Exposure Equipment]

FIG. 7 is a float chart showing a basic operation of an exposure equipment with a SMIF unit according to the third embodiment.

In the electron-beam exposure equipment according to the present embodiment, a basic operation including transfer, collection, and exposure of the wafer 10, which will be described below, is placed under the control of the controller 5 and the protection plate arrangement mechanism 22.

First, the wafer carrier 1 containing plural wafers 10, each of which is coated with the resist on the surface thereof, is moved from the SMIF-POD 11 through inside the SMIF unit 2 into the space of the transfer unit 17 in the transfer area 3 (Step S31).

Subsequently, the wafers 10 start to be transferred one by one from the wafer carrier 1 positioning in the transfer unit 17 to the load lock chamber 16 situated in the thermal chamber 4 using the transfer mechanism provided in the transfer area 3 (Step S32).

The load lock chamber 16 can contain a single piece of wafer 10 being subject to exposure at the maximum, and two pieces of the wafer 10 can be contained in total in the thermal chamber 4 at the maximum including another one wafer existing in the exposure chamber 14. The wafer 10 transferred to the load lock chamber 16 is transferred into the exposure chamber 14 in the order of FIFO, first in the load lock chamber 16, first thereout, to thereby be mounted and secured onto the wafer stage 13.

At this time, under the control of the protection plate arrangement mechanism 22 based on the controller 5, the protection plate 21 is arranged to the wafer carrier 1 during the time just after the wafer 10 is transferred to the load lock chamber 16 and before the next wafer 10 is transferred (Step S33). At this time, when the protection plate 21 is the shielding plate 21a, the shielding plate 21a is arranged such that only the surface of the wafer carrier 1 is shielded, while when the protection plate 21 is the shroud 21b, the shroud 21b is arranged such that the wafer carrier 1 is isolated from the space of the transfer unit 17. The protection plate 21 is made to be detached from the wafer carrier 1 when the wafer 10 is transferred to the load lock chamber 16. With this configuration, the line width fluctuation in the pattern of the wafer 10 can be suppressed still further.

Subsequently, a determination is made to determine whether or not the wafer 10 exists in the load lock chamber 16 attains the upper limit value in number, in this case "one", in other words, whether or not there exist two wafers 10 in the two vacuum chambers situated in the thermal chamber 4 (Step S34).

When it is determined that the upper limit value is not attained in Step S34, then the transfer of the wafer 10 to the load lock chamber 16 in the Step S32 is continued until the upper limit value is attained. In the mean time, the arrangement and detachment of the protection plate 21 to/from the wafer carrier 1 is performed.

Meanwhile, when it is determined that the upper limit value is attained, then the exposure of the wafer 10 mounted and secured onto the wafer stage 13 in the exposure chamber 14 is started (Step S35). Note that, in the initial stage of the basic operation, in the case for example of the first wafer 10, the exposure may be designed to start at the step where the first wafer 10 is mounted and secured onto the wafer stage 13 in the exposure chamber 14 after being transferred from the wafer carrier 1 positioning in the transfer unit 17 via the load lock chamber 16.

At this time, when the exposure in Step S35 is started, the wafer carrier 1 positioning in the transfer unit 17 is returned from the transfer unit 17 to the SMIF-POD 11 (Step S36).

Generally, an electron-beam exposure takes a long time, and when the wafer carrier 1 is kept waiting in the transfer unit 17 during that time, the wafer 10 in the wafer carrier 1 is exposed to the airflow generated by the FFU 3a. In the present embodiment, when the wafer 10 is exposed (or when the number of the wafer(s) 10 contained in the load lock chamber 16 attains the upper limit value), the wafer carrier 1 is returned to the SMIF-POD 11 to let the SMIF-POD 11 wait in the state of containing the wafer carrier 1, so that no wafer 10 is left in the transfer unit 17 during the exposure. Accordingly, it is possible to prevent the line width fluctuation of the pattern due to the wafer carrier 1 waiting in the transfer unit 17, without limiting any airflow generated by the FFU 3a.

When the exposure of the wafer 10 mounted and secured onto the wafer stage 13 is completed (Step S37), the wafer carrier 1 contained and kept waiting in the SMIF-POD 11 is moved again into the space of the transfer unit 17 in the transfer area 3 (Step S38).

Subsequently, the wafer 10 completing the exposure is collected into the wafer carrier 1 via the load lock chamber 16 from the inside of the exposure chamber 14 (Step S39).

Subsequently, a determination is made to determine whether or not the wafer 10 being not yet subject to the exposure exists in the wafer carrier 1, in other words, whether or not there is the wafer 10 that should be transferred to the two vacuum chambers situated in the thermal chamber 4 from the wafer carrier 1 positioning in the transfer unit 17 (Step S40). When it is determined in the Step S40 that there is the wafer 10 being not yet subject to the exposure, the Steps S32 to S40 are repeated once again.

Meanwhile, when it is determined that there is no wafer 10 being not yet subject to the exposure in Step S40, the respective steps related to the exposure of every wafer 10 existing in the thermal chamber 4, the wait of the wafer carrier 1 in the SMIF-POD 11, and the collection of the exposed wafer 10 are performed in sequence. In other words, the Steps S35 to S39 (the steps surrounded by a broken line in FIG. 7) are performed. The series of Steps S35 to S39 to be performed when it is determined that there is no wafer 10 being not yet subject to the exposure are repeated times, "n" (once in the present embodiment) being the number of times corresponding to the maximum number "n" of the wafer(s) 10 ("one" piece in this case) containable in the load lock chamber 16.

As a result of the above, every wafer 10 contained in the wafer carrier 1 have been exposed and collected into the wafer carrier 1.

After that, the wafer carrier 1 positioning in the transfer unit 17 is returned from the transfer unit 17 to the SMIF-POD 11 (Step S41) to end the basic operation.

It should be noted that, in the above description, the basic operation in which every wafer 10 contained in the wafer carrier 1 are exposed is described, however, the basic operation in which a part of the wafers 10 contained in the wafer carrier 1 are appropriately exposed is also acceptable. For instance, in the case of the wafer carrier 1 containing "a" ($a > b \geq 1$) pieces of wafers 10, when the exposure is performed only to "b" pieces of wafers 10, what to do is simply to configure to perform the series of Steps S35 to S39 once after the "bth" wafer 10 is transferred to the load lock chamber 16.

As described above, according to the exposure equipment and the controlling method thereof of the present embodiment, even if the processing for a wafer 10 takes an extremely long time as in the case of the electron-beam equipment, the influence of the airflow on the wafer 10 is shielded, and thereby the deterioration of the resist is prevented to thereby suppress the line width fluctuation of the pattern, so that a highly reliable exposure that can adequately respond to further microfabrication of the patterns can be realized. In particular, even if it is a shorter time period as compared to the exposure time, the wafer carrier 1 is inevitably exposed to the airflow in the space of the transfer unit 17. Accordingly, even though a slight line width fluctuation is probably no need to be concerned since the wafer carrier is inevitably exposed to the airflow in the space of the transfer unit even though it is a short time period as compared to the exposure time, with the configuration of the present embodiment, the airflow to the wafer carrier is shielded even for the short time, so that the line width fluctuation of the patterns is further suppressed and the pattern exposure of an extremely high reliability can be obtained.

Note that, in the first to third embodiments, cases based on the SMIF method using a SMIF unit is presented as examples, whereas a configuration being similar to the SMIF-POD and capable of containing a wafer with ease can bring about the same effect as of the first to third embodiments.

According to the present invention, in the lithography system in which the exposure equipment and the other equipment are separately installed, it is possible to suppress the line width fluctuation of the pattern by preventing the deterioration of the resist, and to realize the highly reliable exposure that can adequately respond to further microfabrication of the patterns, even if the processing for a wafer tasks an extremely long time as in the electron-beam exposure.

The present embodiments are to be considered in all respects as illustrative and no restrictive, and all changes which come within the meaning and range of equivalency of the claims are therefore intended to be embraced therein.

The invention may be embodied in other specific forms without departing from the spirit or essential characteristics thereof.

What is claimed is:

1. An exposure equipment comprising:
   a wafer carrier being flexibly movable and containable plural wafers being subject to exposure;
   a container containing said wafer carrier in an attachable/detachable manner;
   an equipment including a mounting table for said wafer in an exposure chamber thereof and exposing a surface of said wafer mounted on the mounting table;
   a transfer area including, between said container and said equipment, a transfer unit having a space to transfer said wafer carrier therethrough and an airflow generating unit generating an airflow in the space of the transfer unit to maintain cleanliness in the transfer unit; and
   a controller controlling a transfer operation of said wafer carrier and the wafer;
   wherein said controller moves said wafer carrier from said container, controls a transfer and a collection of the wafer between an inside of the space of the transfer unit and said equipment, returns said wafer carrier containing wafers which are not exposed by said equipment into said container when said wafer is exposed to keep said wafer carrier waiting in said container.

2. The exposure equipment according to claim 1, wherein said controller transfers the wafer from said wafer carrier positioning in the space of the transfer unit to said equipment until said wafer(s) placed in said equipment attain(s) an upper limit in number containable in said equipment, and returns said wafer carrier from the space of the transfer unit to said container when the number of the wafer(s) attains the upper limit.

3. The exposure equipment according to claim 2, wherein said equipment includes a load lock unit arranged between the transfer unit and the exposure chamber, wherein the number of the wafer(s) containable in the load lock unit is at least one; and wherein the number of the wafers containable in said equipment is at least two.

4. The exposure equipment according to claim 1, wherein said transfer area includes a protection plate for said wafer carrier and a protection plate arrangement mechanism to arrange the protection plate so as to shield said wafer carrier against the airflow when said wafer carrier is transferred to the transfer unit by said controller.

5. The exposure equipment according to claim 1, wherein the protection plate has a shape shielding only such a portion of said wafer carrier that confronts an airflow direction.

6. The exposure equipment according to claim 1, wherein the protection plate has a shape covering said wafer carrier to isolate said wafer carrier from the space of the transfer unit.

7. The exposure equipment according to claim 1, wherein said controller returns said wafer carrier containing wafers which are not exposed by said equipment into said container when said wafer is exposed and thereafter keeps said wafer carrier waiting in said container until the wafer completes the exposure.

8. A control method of an exposure equipment comprising the steps of:
   moving the wafer carrier from the container to the space of the transfer unit;

transferring the wafer from the inside of the space of the transfer unit to the equipment;

exposing the surface of the wafer set on the mounting table;

returning the wafer carrier containing wafers which are not exposed by said equipment into the container when the wafer is exposed to keep the wafer carrier waiting in the container;

moving the wafer carrier from the container to the space of the transfer unit when the wafer completes the exposure; and collecting the wafer completing the exposure from the equipment to the wafer carrier, using an exposure equipment including a wafer carrier being flexibly movable and containable plural wafers being subject to exposure; a container containing the wafer carrier in an attachable/detachable manner; an equipment including a mounting table for the wafer in an exposure chamber thereof and exposing a surface of the wafer mounted on the mounting table; a transfer area including, between the container and the equipment, a transfer unit having a space to transfer the wafer carrier therethrough and an airflow generating unit generating an airflow in the space of the transfer unit to maintain cleanliness in the transfer unit; and a controller controlling a transfer operation of the wafer carrier and the wafer.

9. The control method of the exposure equipment according to claim 8, wherein, in said step of transferring the wafer to the equipment, the wafer is transferred from the wafer carrier positioning in the space of the transfer unit to the equipment until the wafer(s) placed in the equipment attain(s) an upper limit in number containable in the equipment, and wherein, in said step of returning the wafer carrier into the container to keep the wafer carrier waiting, the wafer carrier is returned from the space of the transfer unit to the container when the number of the wafer(s) attain(s) the upper limit.

10. The control method of the exposure equipment according to claim 8, wherein, when the wafer carrier positions in the space of the transfer unit, a protection plate is arranged so as to shield the containable plural wafers in the wafer carrier against the airflow.

11. The control method of the exposure equipment according to claim 10, wherein the protection plate shields only such a portion of the wafer carrier that confronts an airflow direction.

12. The control method of the exposure equipment according to claim 10, wherein the protection plate covers the wafer carrier to isolate the wafer carrier from the space of the transfer unit.

13. The control method of the exposure equipment according to claim 8, wherein, in said step of keeping said wafer carrier waiting in said container, said wafer carrier containing wafers which are not exposed by said equipment is returned into said container when said wafer is exposed and thereafter said wafer carrier is kept waiting in said container until the water completes the exposure.

* * * * *